United States Patent
Park

(10) Patent No.: US 7,417,308 B2
(45) Date of Patent: Aug. 26, 2008

(54) STACK TYPE PACKAGE MODULE AND METHOD FOR MANUFACTURING THE SAME

(75) Inventor: Myung Geun Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 337 days.

(21) Appl. No.: 11/291,612

(22) Filed: Dec. 1, 2005

(65) Prior Publication Data

US 2007/0051664 A1    Mar. 8, 2007

(30) Foreign Application Priority Data

Sep. 7, 2005    (KR) .................... 10-2005-0083236

(51) Int. Cl.
  *H01L 23/02* (2006.01)
  *H01L 21/50* (2006.01)
  *H01L 21/48* (2006.01)
  *H01L 21/44* (2006.01)

(52) U.S. Cl. .................... 257/686; 257/685; 438/109

(58) Field of Classification Search ......... 257/685–686; 438/109

See application file for complete search history.

(56) References Cited

U.S. PATENT DOCUMENTS

| | | | |
|---|---|---|---|
| 6,239,496 B1 * | 5/2001 | Asada | 257/777 |
| 6,335,565 B1 * | 1/2002 | Miyamoto et al. | 257/686 |
| 6,528,870 B2 * | 3/2003 | Fukatsu et al. | 257/685 |
| 6,664,616 B2 * | 12/2003 | Tsubosaki et al. | 257/668 |
| 7,224,044 B2 * | 5/2007 | Kawada et al. | 257/666 |

FOREIGN PATENT DOCUMENTS

KR    2000-0053511    8/2000

* cited by examiner

*Primary Examiner*—Luan Thai
(74) *Attorney, Agent, or Firm*—Ladas & Parry LLP

(57) ABSTRACT

The stack type package module includes a plurality of stacked tape carrier packages. Each package has an elongated lead having an extension end connected to the first lateral end connected to a central portion connected to a second lateral end. The second lateral end is connected to the respective chip via a bump. The packages made as such are then stacked on top of each other on a printed circuit board. The plurality of the stacked first lateral ends are then cut and soldered the printed circuit board. The predetermined portions of the packages including the cut first lateral ends are sealed for protection.

5 Claims, 4 Drawing Sheets

STACK TYPE PACKAGE MODULE AND METHOD FOR MANUFACTURING THE SAME

BACKGROUND OF THE INVENTION

1. Field of the invention

The present invention relates generally to a stack type package module and a method for manufacturing the same. More particularly, the present invention relates to a stack type package module using a tape carrier and a method for manufacturing the same.

2. Description of the Prior Art

Recently, there exist various demands for further improving the semiconductor technologies, such as in the areas of lightness, compactness, multi-functions, high-performance, and low fabrication costs. In order to satisfy the above demands, semiconductor package technologies have been suggested. Among many semiconductor package technologies, a ball grid array (BGA) package technology capable of fabricating a BGA package in a size similar to the size of a semiconductor chip is currently being spotlighted.

According to the conventional BGA package, as shown in FIG. 1, a chip 20 is mounted on an upper surface of an array substrate 10, and mold resin 30 is molded thereon. In addition, solder balls 40 are aligned at the bottom surface of the array substrate 10 in such a manner that the array substrate 10 can be connected to a printed circuit board 50 through the solder balls 40.

However, in the solder joints, which are one of the most important elements for determining reliability of the BGA package, of the conventional BGA package described above, a crack may appear in the solder balls 40 interposed between the package 10, 20, 30 and the printed circuit board 50 for the majority of the temperature cycle (TC).

There are various reasons for the solder balls cracking. One reason is a differential heat expansion coefficient between mutually different materials. That is, fatigue accumulates in the solder balls due to the differential heat expansion coefficient between the package 10, 20, 30 and the printed circuit board 50, resulting in the cracking of the solder balls 40.

The crack created in the solder balls may degrade the reliability of the semiconductor package.

SUMMARY OF THE INVENTION

Accordingly, the present invention has been made to solve the above-mentioned problems occurring in the prior art, and an object of the present invention is to provide a stack type package module having an improved structure and a method for manufacturing the same, which is capable of improving the reliability of a semiconductor package.

In order to accomplish the above object, according to one aspect of the present invention, there is provided a stack type package module comprising: a lower tape carrier package provided on a printed circuit board and including a lower lead exposed to an exterior, in which a first lateral end of the lower lead is soldered on the printed circuit board; an upper tape carrier package stacked on the lower tape carrier package and including an upper lead exposed to an exterior, in which a first lateral end of the upper lead is soldered on the first lateral end of the lower lead and a structure of the upper tape carrier package is identical to that of the lower tape carrier package; and a non-conductive lead sealant for sealing the lower lead soldered on the printed circuit board and the upper lead soldered on the lower lead.

According to the preferred embodiment of the present invention, the lower tape carrier package includes the lower lead; lower base films formed on upper and lower surfaces of the lower lead in opposition to each other such that first and second lateral ends of the lower lead are exposed to the exterior; a lower chip mounted on one surface of the first lateral end of the lower lead through a lower bump; and a lower sealant for sealing the first lateral end of the lower lead adjacent to the lower bump, a first lateral end of the lower base film, and a surface of the lower chip adjacent to the lower bump.

Preferably, the lower and upper tape carrier packages are symmetrically stacked on upper and lower surfaces of the printed circuit board.

According to another aspect of the present invention, there is provided a method for manufacturing a stack type package module, the method comprising the steps of: forming base films on upper and lower center portions of a lead and upper and lower surfaces of a first lateral end of the lead spaced apart from the upper and lower center portions of the lead by a predetermined distance; mounting a chip on one surface of a second lateral end of the lead by using a bump and sealing the chip, thereby fabricating a plurality of tape carrier packages; stacking the plural tape carrier packages with each other; mounting the stacked tape carrier packages on one surface of a printed circuit board; and cutting predetermined portions of the leads, which are formed between center portions and first lateral ends of the leads, extending from the stacked tape carrier packages to an exterior and soldering the cutting portions on the printed circuit board.

According to the preferred embodiment of the present invention, the method further includes a step of sealing first lateral ends of the lower and upper leads soldered on the printed circuit board by means of a sealant after soldering the first lateral end of the lower lead on the printed circuit board.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
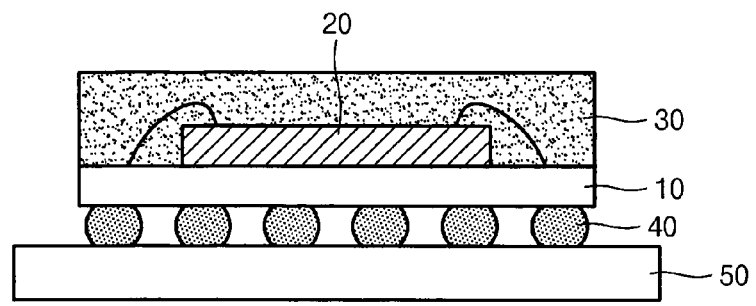
FIG. 1 is a cross-sectional view for illustrating a conventional stack type package module.

Hereinafter, the present invention will be described in detail with reference to accompanying drawings.

According to a stack type package module of the present invention, a plurality of tape carrier packages are stacked on a printed circuit board, and the tape carrier packages and the printed circuit board are electrically connected by leads. In addition, the leads are sealed by means of a lead sealant.

Although the total number of stackable tape carrier packages is not limited to two, only two tape carrier packages consisting of upper and lower carrier packages are shown in the drawings of the present application for illustration.

Figure 2:
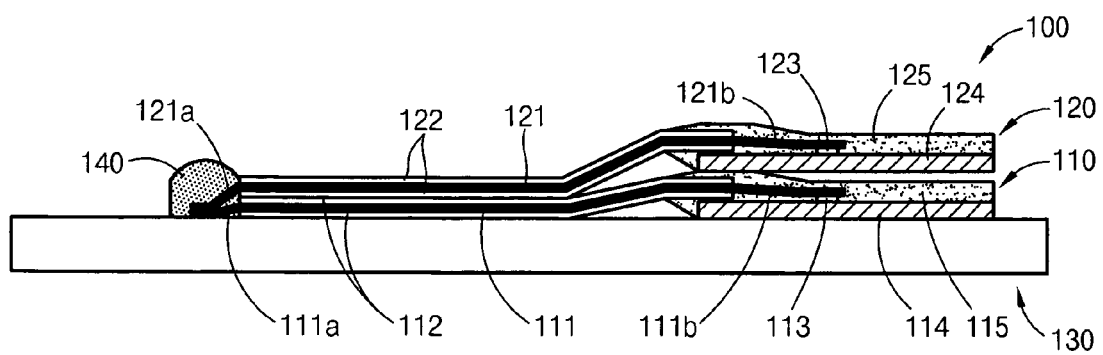
FIG. 2 is a cross-sectional view for illustrating a stack type package module according to one embodiment of the present invention.

FIG. 2 is a cross-sectional view for illustrating a stack type package module according to one embodiment of the present invention.

Referring to FIG. 2, the stack type package module 100 includes a lower tape carrier package 110, an upper tape carrier package 120 staked on the lower tape carrier package 110, a printed circuit board 130 on which the stacked lower and upper tape carrier packages 110 and 120 are mounted, and a lead sealant 140 for sealing leads 111 and 121 of the stacked lower and upper tape carrier packages 110 and 120 to protect the leads 111 and 121 soldered on the printed circuit board 130 from external impact.

Herein, one lateral end 121*a* of the upper lead 121 of the upper tape carrier package 120 provided on the printed circuit board 130 is soldered on one lateral end 111*a* of the lower lead 111 of the lower tape carrier package 110 directly soldered on the printed circuit board 130, so that the upper tape carrier package 120 is electrically connected to the printed circuit board 130 through the lower lead 111 of the lower tape carrier package 110.

The lower tape carrier package 110 includes the lower lead 111 having two lateral ends 111*a*, 111*b*; lower base films 112 protecting a portion of the lower lead 111 between the two lateral ends 111, 111*b*; a lower bump 113 connecting the lateral end 111*b* to the lower chip 114; the lower chip 114 formed on the printed circuit board 130, and a lower sealant 115.

The lower lead 111 is formed on the printed circuit board 130 with circuit patterns as shown in FIG. 2 such that the lateral end 111*a* of the lower lead 111 is soldered to the printed circuit board 130 and the other lateral end 111*b* is connected to the lower bump 113, so that the lower lead 111 is electrically connects the lower chip 113 and the printed circuit board 130.

The lower base films 112 may be formed of flexible films and are aligned at upper and lower surfaces of one (or a plurality of) the lower lead(s) 111 such that both lateral ends 111*a* and 111*b* of each lower lead 111 are not sealed by the lower base films 112. The lower base films 112 protect the circuit patterns of the lower lead 111 from external influences, for example, external impact, put on either the upper and lower surfaces of the lower lead 111.

The lower bump 113 is a medium for mounting the lower chip 114 at a lower portion of the lateral end 111*b* of the lower lead 111.

The lower sealant 115 is provided to protect both the lower lead 111 and the lower chip 114 mounted under some portion of the lower lead 111 from the negative external influence including impact. To this end, the lower sealant 115 seals the lateral end 111*b* of the lower lead 111 including the portion of the lower base films 112 formed near the lateral end 111*b*, and an upper portion of the lower chip 114. The lower portion of the lower chip 114, which is not sealed by the lower sealant 115, makes contact with the printed circuit board 130.

Herein, one lateral end 111*a* of the lower lead 111 soldered on the printed circuit board 130 can be considered as an outer lead, while the other lateral end 111*b* of the lower lead 111 sealed by the lower sealant 115 can be considered as an inner lead.

Figure 3:
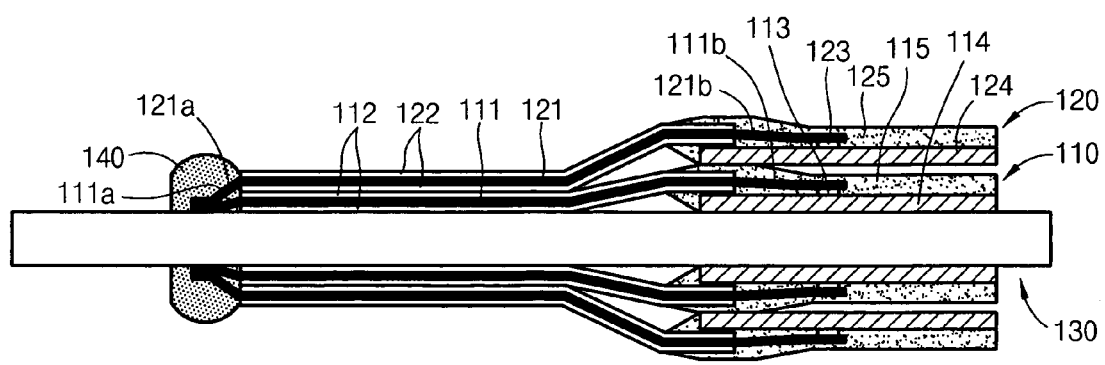
FIG. 3 is a cross-sectional view for illustrating a stack type package module according to another embodiment of the present invention.

The upper tape carrier package 120 has the structure identical to that of the lower tape carrier package 110, except that the upper chip 124 is mounted on the lower chip 114 instead of the printed circuit board 130. The structure of the upper tape carrier package comprising the upper chip 124, upper bump 123, the lead 121 having the lateral ends 121*a*, 121*b*, the upper sealant 125 as shown in FIG. 2 can be easily understood from the above disclosure with respect to the lower tape carrier package 110 and FIG. 2. The detailed description about the structure of the upper tape carrier package 120, which follows the same or the substantially similar concept or structure of the lower tape carrier package 110, therefore will be omitted. According to another embodiment of the present invention as shown in FIG. 3, the stacked lower and upper carrier packages 110 and 120 (such as that shown in FIG. 2) are provided at both the upper and lower surfaces of the printed circuit board 130, thereby increasing capacity of the semiconductor package.

According to the stack type package module having the above structure, the outer lead (such as 111*a* or 121*a*) of the tape carrier package (such as 110 or 120) is soldered on the printed circuit board (such as 130) so that the tape carrier package (such as 110 or 120) can be easily mounted on the printed circuit board (such as 130) while minimizing the overall mounting space for the tape carrier package (such as 110 or 120). Thus, the present invention is different from and overcome the prior art problems caused by the cracked solder balls. The present invention does not cause the crack to be formed in the solder balls (such as 140). This is because the base films (such as 112, 122) having the flexible property may attenuate the stress caused by the differential heat expansion coefficient between the printed circuit board (such as 130) and the tape carrier package (such as 110 or 120).

FIGS. 4A to 4E are cross-sectional views for illustrating the procedure for manufacturing the stack type package module according to one embodiment of the present invention.

Figure 4A:
FIGS. 4A to 4E are cross-sectional views for illustrating the procedure for manufacturing a stack type package module shown in FIG. 2.

Referring to FIGS. 4A to 4E, a lead 210 has two lateral ends 210*a*, 210*b*. The lateral end 210*a* of the lead 210 is extended further by an extension end 210*c* (the purpose of the extension end 210*c* is explained in detail below). The lead 210 can be formed with circuit patterns although this is not clearly shown in FIG. 4A. Then, flexible base films 220 are stacked on upper and lower portions of the lead 210 to cover the central portion of the lead 210 and the extension end 210*c*, but not to cover the two lateral ends 210*a*, 210*b* as shown in FIG. 4A. This protects the circuit patterns from negative external influence such as impact. The reason for stacking the flexible base films 220 on the extension end 210*c* of the lead 210 is to support the lead part 210*a* exposed to the exterior between the center portion and the extension end 210*c* of the lead 210. This will be described more below with respect to FIGS. 4C-4E.

Figure 4B:
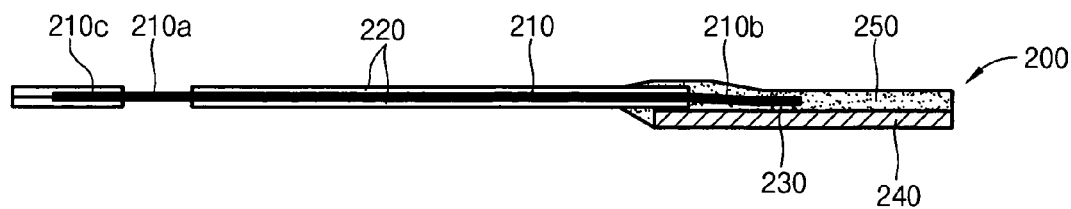
Figure 4C:
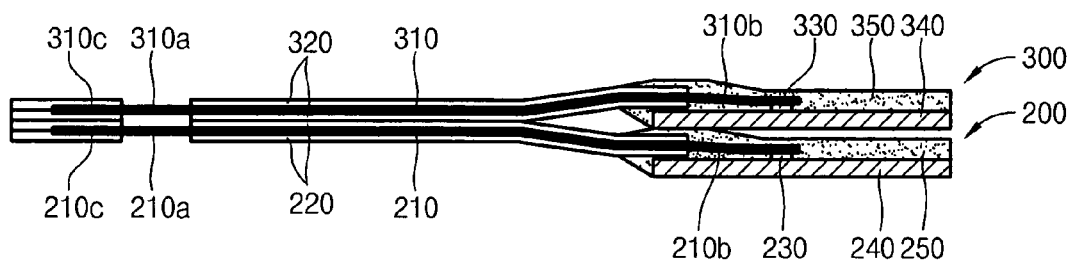

As shown in FIG. 4B, a bump 230 is provided at the lateral end 210*b* of the lead 210 (where the flexible base film 220 is not formed). The chip 240 is mounted on the bump 230.

Then, the chip mounting section, which covers a portion of the lead 210 near the lateral end 210*b* covered with flexible base films 220, the other lateral end 210*b* of the lead 210, and the upper surface of the chip 240, are sealed with a sealant 250 as shown in FIG. 4B such that they are shielded from the exterior, thereby completing the fabrication of a tape carrier package 200.

Now referring to FIG. 4, a tape carrier package 300 can be made by applying the same technique as above. The tape carrier packages 200 and 300, fabricated by repeating the above procedures, are then stacked as shown in FIG. 4C.

Figure 4D:
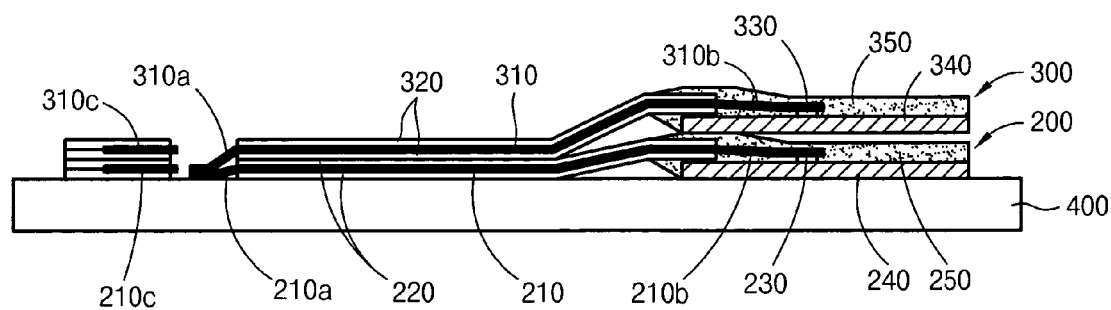

Then, the stacked tape carrier packages 200 and 300 are mounted on one surface of a printed circuit board 400 as shown in FIG. 4D. The lateral ends 210*a*, 310*a* of the packages 200, 300 are exposed to the exterior because the base films 220 and 320 are not formed on these portions of the leads 210, 310. The lateral ends 210*a*, 310*a* are then cut and soldered on the printed circuit board 400 through a thermal pressing process or the like, so as to electrically connect the lead 210a and 310a to the printed circuit board 400 The lateral end 210a of the lower tape carrier package 200 as shown in FIG. 4D makes direct contact with the printed circuit board 400 by being soldered on to the printed circuit board 400. The lateral end 310a of the upper tape carrier package 300 is connected to the lateral end 210a of the lower tape carrier package 200 aligned below the other tape carrier package 300 also as shown in FIG. 4D. The lateral end 310a thereby indirectly connects the upper tape carrier package 300 to the printed circuit board 400.

Figure 4E:
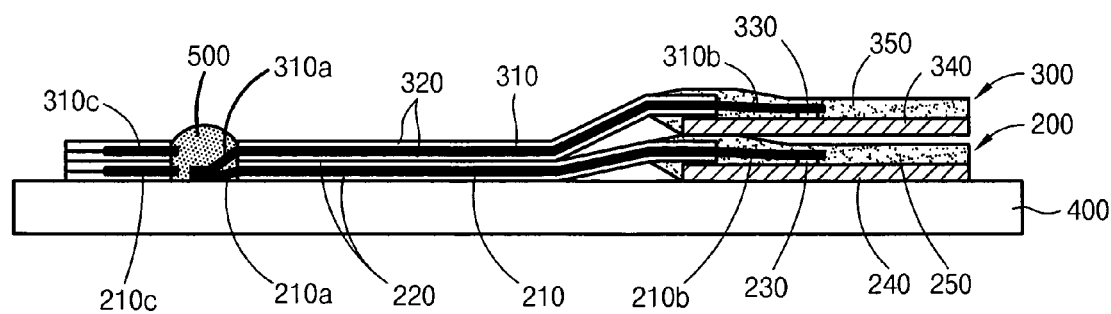

After that, as shown in FIG. 4E, the lateral ends 210a and 310a soldered on the printed circuit board 400 are then sealed by means of a sealant 500 in order to protect the lead parts 210a and 310a from external impact. Herein, the sealant 500 used for sealing the lead parts 210a and 310a soldered on the printed circuit board 400 may be identical to the sealant 250 and 350 used for sealing other lateral ends of the lower and upper leads 210 and 310.

In addition, a plurality of tape carrier packages can be stacked on both the upper and lower surfaces of the printed circuit board 400 such as that shown in FIG. 3 by repeating the above procedures to increase capacity of the semiconductor package.

If the stack type package module is fabricated through the above procedure, the semiconductor package can be easily mounted on the printed circuit board while minimizing the mounting surface for the stack type package module. In addition, since it is not necessary to connect the semiconductor package with the printed circuit board by the solder balls, the defect of the semiconductor package caused by the crack of the solder balls can be prevented.

As described above, according to the stack type package module and the method for manufacturing the same of the present invention, the semiconductor package can be easily mounted on the printed circuit board while minimizing the mounting surface for the stack type package module. In addition, it is possible to reduce the defect of the semiconductor package caused by the differential heat expansion coefficient between mutually different materials.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A stack type package module comprising:
   a lower tape carrier package provided on a first surface of a printed circuit board, the lower tape carrier package comprising a lower lead having a first lower lateral end and a second lower lateral end, a lower base film exposing the first and second lower lateral ends, and a lower chip having a first bump,
   wherein the second lower lateral end is connected to the first bump and an end of the the lower base film is disposed on the lower chip;
   wherein the first lower lateral end is soldered to the printed circuit board;
   an upper tape carrier package stacked on the lower tape carrier package, the upper tape carrier package comprising an upper lead having a first upper lateral end and a second upper lateral end, an upper base film exposing the first and second upper lateral ends, and an upper chip having a second bump,
   wherein the second upper lateral end is connected to the second bump and an end of the upper base film is disposed on the upper chip;
   wherein the first upper lateral end is soldered to the first lower lateral end of the lower lead, and
   wherein the structure of the upper tape carrier package is identical to the structure of the lower tape carrier package; and
   a non-conductive lead sealant for sealing the first lower lateral end soldered on the printed circuit board and the first upper lateral end soldered on the first lower lateral end.

2. The stack type package module as claimed in claim 1, wherein either the upper tape carrier package or the lower tape carrier package further comprises:
   a non-conductive lead sealant for sealing at least the second upper lateral end and the respective bump connecting the second upper lateral end to the upper tape carrier package and for sealing at least the second lower lateral end and the respective bump connecting the second lower lateral end to the lower tape carrier package.

3. The stack type package module as claimed in claim 1, wherein one additional set of the lower and upper tape carrier packages as recited in claim 1 is symmetrically stacked on a second surface opposite the first surface of the printed circuit board.

4. A method of manufacturing a stack type package module, the method comprising the steps of:
   providing a lead having an extension end connected to a first lateral end connected to a central lead portion connected to a second lateral end;
   forming base films on upper and lower center portions of the lead and upper and lower surfaces of the extension end;
   mounting a chip to the second lateral end using a bump and sealing the portion of the chip having the bump with a sealant, thereby fabricating a tape carrier package;
   producing a plurality of tape carrier packages by repeating the above three steps of providing a lead, forming base films, and mounting a chip to the second lateral end a predetermined number of times;
   stacking the plurality of tape carrier packages, one package on top of another such that the extension ends, the lateral ends and the chips of each tape carrier package are aligned:
   mounting the stacked tape carrier packages of step stacking the plurality tape carrier packages, one package on top of another such that the extension ends, the lateral ends and the chips are aligned on one surface of a printed circuit board;
   cutting the first lateral ends of the stacked tape carrier packages; and
   soldering the cut first lateral ends to the printed circuit board.

5. The method as claimed in claim 4, further comprising the step of:
   sealing the first lateral ends of the stacked tape carrier packages that are soldered to the printed circuit board with a sealant.

* * * * *